(12) United States Patent
Yonezawa et al.

(10) Patent No.: US 8,324,631 B2
(45) Date of Patent: Dec. 4, 2012

(54) SILICON CARBIDE SEMICONDUCTOR DEVICE AND METHOD FOR MANUFACTURING THE SAME

(75) Inventors: Yoshiyuki Yonezawa, Matsumoto (JP); Takeshi Tawara, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 170 days.

(21) Appl. No.: 11/865,851

(22) Filed: Oct. 2, 2007

(65) Prior Publication Data
US 2008/0079008 A1 Apr. 3, 2008

(30) Foreign Application Priority Data
Oct. 3, 2006 (JP) .................. 2006-271450

(51) Int. Cl.
*H01L 29/15* (2006.01)
*H01L 21/18* (2006.01)

(52) U.S. Cl. ...... 257/77; 257/28; 257/607; 257/E29.104; 257/E21.056; 257/E21.106; 438/510; 438/931

(58) Field of Classification Search .............. 257/77, 257/607, 617, E21.095, E21.106, 28, 190, 257/196, 627, 628, 917, E29.084, E29.086, 257/E21.056, E21.092, E21.115, E29.104; 438/548, 569, 914, 931, 508, 546, 547, 510
See application file for complete search history.

(56) References Cited

U.S. PATENT DOCUMENTS 7,391,058 B2 * 6/2008 Rowland et al. ............ 257/77
2005/0184296 A1 * 8/2005 Sudarshan et al. .......... 257/77
2006/0267022 A1 * 11/2006 Mizukami et al. .......... 257/77
2007/0032053 A1 * 2/2007 Seki et al. ................. 438/507

FOREIGN PATENT DOCUMENTS

| JP | 61-291495 A | 12/1986 |
| JP | 06-334214 A | 12/1994 |
| JP | 3462506 B2 | 8/2003 |
| JP | 2004-343133 A | 12/2004 |
| JP | 2005-294611 A | 10/2005 |
| WO | 9747045 A1 | 12/1997 |

OTHER PUBLICATIONS

Japanese Office Action corresponding to JP 2006-271450 dated Jun. 21, 2011. Partial translation of "Notification of Reasons for Refusal" provided.

* cited by examiner

*Primary Examiner* — Kenneth Parker
*Assistant Examiner* — Yu Chen
(74) *Attorney, Agent, or Firm* — Rossi, Kimms & McDowell LLP

(57) ABSTRACT

A SiC semiconductor substrate is disclosed which includes a SiC single crystal substrate, a nitrogen (N)-doped n-type SiC epitaxial layer in which nitrogen (N) is doped and a phosphorus (P)-doped n-type SiC epitaxial layer in which phosphorus (P) is doped. The nitrogen (N)-doped n-type SiC epitaxial layer and the phosphorus (P)-doped n-type SiC epitaxial layer are laminated on the silicon carbide single crystal substrate sequentially. The nitrogen (N)-doped n-type SiC epitaxial layer and the phosphorus (P)-doped n-type SiC epitaxial layer are formed by using two or more different dopants, for example, nitrogen and phosphorus, at the time of epitaxial growth. Basal plane dislocations in a SiC device can be reduced.

8 Claims, 2 Drawing Sheets

SILICON CARBIDE SEMICONDUCTOR DEVICE AND METHOD FOR MANUFACTURING THE SAME

CROSS REFERENCE TO RELATED APPLICATIONS

This application claims priority from application Ser. No. JP 2006-271450, filed on Oct. 3, 2006.

BACKGROUND OF THE INVENTION

A. Field of the Invention

The invention relates to silicon carbide semiconductor devices, which use silicon carbide as a semiconductor material, and a method for manufacturing such silicon carbide semiconductor devices.

B. Description of the Related Art

Technical advantages for high frequency control and high power control have been offered conventionally by various techniques in a power semiconductor device (hereinafter referred to as a power device) using silicon (Si). On the other hand, there are situations in which the power device using Si cannot be used, such as in a high temperature environment or in an environment in which there are radioactive rays. Because of this, a power device having higher performance than the power device using Si has been developed.

As a material of such a high-performance power device, silicon carbide (hereinafter referred to as SiC) has been studied. A band gap of SiC is wider than that of Si, for example, 3.26 eV for SiC of 4H type (hereinafter referred to as 4H—SiC) and 3.02 eV for 6H—SiC. Because of this, SiC is superior in controllability of conductivity in the high temperature environment, and in resistance to radiation. In addition, SiC can be applied to a high breakdown voltage device because its dielectric breakdown voltage is higher than that of Si by about one order of magnitude. Further, SiC is suitable for high frequency control and high power control because an electronic saturation drift velocity of SiC is about 2 times of that of Si. There are various crystal polymorphs (polytypes) in SiC, and 4H—SiC in the polymorphs attracts attention as a material for the power device which has especially superior physical properties.

On the other hand, there are a lot of crystal defects and dislocations in single crystal SiC, and it is thought that these crystal defects and dislocations give characteristics of a SiC device a bad influence. As a representative large-sized defect of 4H—SiC, a micropipe defect is known. The micropipe defect has the Burgers vector of magnitude of more than the 3 c (3 times of interatomic distance of C-axis direction), and is a hollow defect that penetrates through in the C-axis direction. The breakdown voltage of the device is decreased remarkably due to the micropipe defect.

A technique to blockade the micropipe defect by epitaxial growth is reported to prevent the device from decreasing the breakdown voltage due to the micropipe defect. However, the technique resolves the micropipe defect which is a screw dislocation having the Burgers vector of Nc (N≧3) into a screw dislocation having the Burgers vector of less than or equal to 2 c, and it is not a technique in which the dislocation itself is removed.

In addition, as other large-sized defect of 4H—SiC, a carrot defect is known. The carrot defect occurs by a screw dislocation and a basal plane dislocation (hereinafter referred to as BPD). It is reported that defect density can be reduced by performing epitaxial growth in high temperature. In addition, it is known that the BPD changes direction at the boundary face between an epitaxial film and a substrate, and is converted into an edge dislocation.

In addition, in Japanese Patent No. 3462506 (line 41 of left column to line 1 of right column on page 9), of which the corresponding foreign Patent Application is International Publication No. WO 97/47045, aluminum (Al), boron (B) or gallium (Ga) is given as a dopant when a p-type region of a semiconductor device is formed. Nitrogen (N) or phosphorus (P) is the dopant when an n-type region is formed. In addition, Japanese Patent Laid-Open No. 61-291495 (claims and embodiment on page 3) discloses a technique in which two kinds of dopants (impurities) are used when a SiC film is grown on a semiconductor substrate.

Although according to the prior art, generation of the large-sized defects, such as, for example, micropipe and carrot defects, can be decreased, it is difficult to decrease the BPDs. The BPD causes a stacking fault, and it might cause fluctuation of a forward voltage and generation of a leakage current of the SiC device. Thus, it is important that the BPDs are decreased to improve characteristics of the SiC device.

In addition, although kinds of dopants to form the p-type region and the n-type region have been described in Japanese Patent No. 3462506, it has not been shown that defects can be reduced when these dopants are used, or in what kinds of conditions. In addition, the generation of defects is not considered in Japanese Patent Laid-Open No. 61-291495, and there is no disclosure whether the BPDs can be reduced by using the dopants in the description.

SUMMARY OF THE INVENTION

The invention addresses the problems discussed above, and aims to provide SiC semiconductor devices and a method for manufacturing such SiC semiconductor devices which can reduce the BPDs existing in the device and can improve characteristics of the SiC semiconductor device.

To solve the above problem and achieve the object, the inventors have devoted themselves to research. As a result, it has been thought that the BPD could be converted into an edge dislocation by the effect of lattice strain due to dopants at an interface where conductivity type and doping concentration change steeply. It has been found that the BPDs were converted into edge dislocations by laminating an epitaxial layer using two kinds of dopants which are nitrogen (N), in which a change of a lattice constant is large in comparison with a non-doped state, and phosphorus (P), in which the change of the lattice constant is small in comparison with the non-doped state.

The invention is based on this finding, and according to a first aspect of the invention a method for manufacturing a silicon carbide semiconductor device in which a silicon carbide epitaxial layer of a p-type or an n-type is laminated on a silicon carbide substrate includes forming the silicon carbide epitaxial layer by using two or more different impurities as dopants.

The method for manufacturing the silicon carbide semiconductor device according to a second aspect of the invention is characterized in that, in the first aspect of the invention, the silicon carbide epitaxial layer is a silicon carbide epitaxial layer of an n-type, and nitrogen and phosphorus are used as the impurities when the silicon carbide epitaxial layer is formed. The method for manufacturing the silicon carbide semiconductor device according to a third aspect of the invention is characterized in that, in the first aspect of the invention, the silicon carbide epitaxial layer is a silicon carbide epitaxial layer of a p-type, and at least two of boron, aluminum and indium are used as the impurities when the silicon carbide epitaxial layer is formed. The method for manufacturing the silicon carbide semiconductor device according to a fourth aspect of the invention is characterized in that, in any one of the first aspect through the third aspect of the invention, when the silicon carbide epitaxial layer is formed, at least a first species of two or more different impurities has a high impurity concentration and at least a second species of two or more different impurities has a low impurity concentration.

The method for manufacturing the silicon carbide semiconductor device according to a fifth aspect of the invention is characterized in that, in any one of the first aspect through the fourth aspect, the silicon carbide substrate is doped with a p-type or an n-type impurity, and the impurities when the silicon carbide epitaxial layer is formed are different kinds from the impurity doped in the silicon carbide substrate. The method for manufacturing the silicon carbide semiconductor device according to a sixth aspect of the invention is characterized in that, in any one of the first aspect through the fifth aspect, the silicon carbide epitaxial layer is a first silicon carbide epitaxial layer and a second silicon carbide epitaxial layer in which dopants are different from dopants of the first silicon carbide epitaxial layer, and the first silicon carbide epitaxial layer and the second first silicon carbide epitaxial layer are alternately formed by epitaxial growth.

A silicon carbide semiconductor device according to a seventh aspect of the invention includes a silicon carbide substrate, and a silicon carbide epitaxial layer of an n-type or a p-type formed on the silicon carbide substrate, the silicon carbide epitaxial layer being doped with two or more different impurities as dopants. The silicon carbide semiconductor device according to an eighth aspect of the invention is characterized in that, in the seventh aspect, the silicon carbide epitaxial layer is an n type silicon carbide epitaxial layer in which nitrogen and phosphorus are doped. The silicon carbide semiconductor device according to a ninth aspect of the invention is characterized in that, in the seventh aspect, the silicon carbide epitaxial layer is a p type silicon carbide epitaxial layer in which at least two of boron, aluminum and indium are doped. The silicon carbide semiconductor device according to a tenth aspect of the invention is characterized in that, in any one of the seventh aspect through the ninth aspect, at least a first species of two or more different impurities doped in the silicon carbide epitaxial layer has a high impurity concentration and at least a second species of two or more different impurities doped in the silicon carbide epitaxial layer has a low impurity concentration.

The silicon carbide semiconductor device according to a eleventh aspect of the invention is characterized in that, in any one of the seventh aspect through the tenth aspect, the silicon carbide substrate is doped with a p-type or an n-type impurity, and the silicon carbide epitaxial layer is doped with impurities of different kinds from the impurity introduced into the silicon carbide substrate. The silicon carbide semiconductor device according to a twelfth aspect of the invention is characterized in that, in any one of the seventh aspect through the eleventh aspect, the silicon carbide epitaxial layer is a first epitaxial layer and a second epitaxial layer in which dopants are different from dopants of the first epitaxial layer, and the first epitaxial layer and the second epitaxial layer are formed in plural by alternately laminating.

According to the silicon carbide semiconductor devices and the method for manufacturing such silicon carbide semiconductor devices according to the invention, the BPDs existing in the device can be reduced and characteristics of the SiC semiconductor device can be improved.

BRIEF DESCRIPTION OF THE DRAWINGS

The invention will be described with reference to preferred embodiments and the accompanying drawings, where.

DETAILED DESCRIPTION OF SPECIFIC EMBODIMENTS

Preferred embodiments of silicon carbide semiconductor devices and a method for manufacturing such silicon carbide semiconductor devices according to the invention will be now explained in detail with referring to accompanying drawings.

First Embodiment

Figure 1:
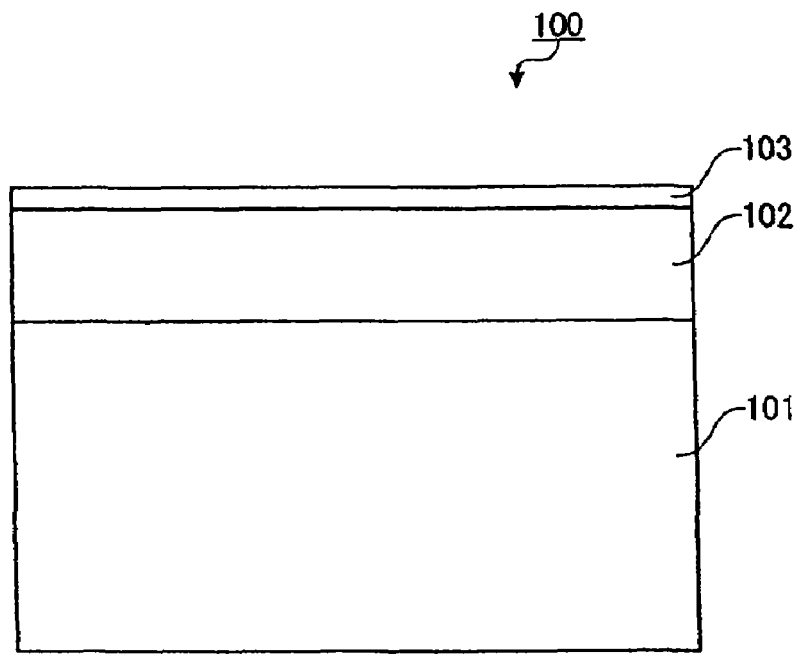
FIG. 1 is cross-sectional view of a SiC semiconductor substrate according to a first embodiment.

FIG. 1 is a cross-sectional view of a SiC semiconductor substrate according to the first embodiment. A SiC semiconductor substrate 100 according to the first embodiment comprises a SiC single crystal substrate 101, an n-type SiC epitaxial layer 102 which is doped with nitrogen (N) and laminated on the SiC single crystal substrate 101, and further an n-type SiC epitaxial layer 103 which is doped with phosphorus (P) and laminated on the n-type SiC epitaxial layer 102.

A manufacturing process of the SiC semiconductor substrate 100 according to the first embodiment will be explained. A 4H—SiC single crystal in which nitrogen (N) is doped with a concentration of $10^{18}$ cm$^{-3}$ is used as a starting substrate. By mirror polishing treatment and CMP (Chemical Mechanical Polishing) treatment, a polished surface is used as a principal surface to be inclined to <11-20> orientation from a (0001) Si face of the starting substrate by eight degrees. In this regard, "-2" of <11-20> orientation expresses that a bar is put on "2".

At first, for example, the starting substrate is cut in the shape of a chip of 5 mm×5 mm square using a dicing saw, and the substrate after cutting is cleaned using organic solvent and acid. Subsequently, the substrate whose surface to etch in in an upward direction is put on a susceptor of graphite coated with silicon carbide (SiC). And the susceptor on which the substrate has been placed is placed in a quartz reaction tube, and a pressure in the quartz reaction tube is made less than or equal to 1 Pa with a vacuum pump.

Subsequently, for example, mixed gas mixed with a hydrogen ($H_2$) flow rate of 10 slm and a hydrogen chloride (HCl) flow rate of 5 sccm is introduced into the quartz reaction tube and the pressure in the reaction tube is set to 100 Torr. In this state, vapor-phase etching is performed at 1600° C. for 5 minutes. In doing so, for example, the susceptor is heated by a high-frequency induction heating method.

Subsequently, for example, a hydrogen ($H_2$) flow rate of 10 slm, a mono-silane ($SiH_4$) flow rate of 3 sccm, a propane ($C_3H_8$) flow rate of 2 sccm, and a nitrogen ($N_2$) flow rate of 1 slm are introduced in the reaction tube, and a 4H—SiC thin film (a nitrogen (N)-doped n-type SiC epitaxial layer 102) is grown epitaxially on the substrate while maintaining a pressure of 90 Torr at 1500° C. for 1 hour. For example, a thickness of the N-doped n-type SiC epitaxial layer 102 is about 10 µm, and N-doping concentration is $10^{19}$ cm$^{-3}$. Thereby, large-sized defects such as micropipe defects and carrot defects on the substrate decrease to, for example, about 0.4/cm$^2$.

Next, after bringing the quartz reaction tube to a vacuum state of less than or equal to 1 Pa again, for example, the hydrogen ($H_2$) flow rate of 10 slm, the mono-silane ($SiH_4$)

flow rate of 3 sccm, the propane ($C_3H_8$) flow rate of 2 sccm and a phosphine ($PH_3$) flow rate of 100 sccm are introduced in the reaction tube, and a phosphorus (P)-doped 4H—SiC thin film (a P-doped n-type SiC epitaxial layer 103) is grown epitaxially at 1500° C. for 12 minutes. For example, a thickness of the P-doped n type SiC epitaxial layer 103 is about 2 μm, and P-doping concentration is $10^{17}$ $cm^{-3}$.

When the dislocation density of the epitaxial growth SiC thin film is studied, BPD density at the time of generating only the N-doped n-type SiC epitaxial layer 102 is about $10^{14}$ $cm^{-2}$. Compared with this, BPD density after having generated the P-doped n-type SiC epitaxial layer 103 is $10^3$ $cm^{-2}$. BPD density after having generated the P-doped n-type SiC epitaxial layer 103 decreases by about 90% in comparison with BPD density at the time of generating only the N-doped n-type SiC epitaxial layer 102. In addition, when dislocation density is studied, defect density is counted by SEM observation after having etched the substrate in potassium hydroxide (KOH). The etching by potassium hydroxide (KOH) is performed by a method which the substrate is dipped for 30 seconds in potassium hydroxide (KOH) which is heated to 500° C. in a nickel (Ni) crucible.

In this manner, the reason why BPD density after having generated the P-doped n-type SiC epitaxial layer 103 decreases in comparison with BPD density at the time of generating only the N-doped n-type SiC epitaxial layer 102 is that BPDs are converted into edge dislocations.

In this manner, fluctuation of a forward voltage can be suppressed, and at the same time defect density relative to leakage current can be largely reduced when the substrate is applied to in particular a vertical device. Because of this, yield can be improved greatly.

Second Embodiment

In the first embodiment, one of each of the two kinds of doped layers (the N-doped n-type SiC epitaxial layer and the P-doped n-type SiC epitaxial layer) are formed on the substrate. In the second embodiment, the two kinds of doped layers are formed repeatedly so that the number of BPDs that are converted into edge dislocations can be increased more.

Figure 2:
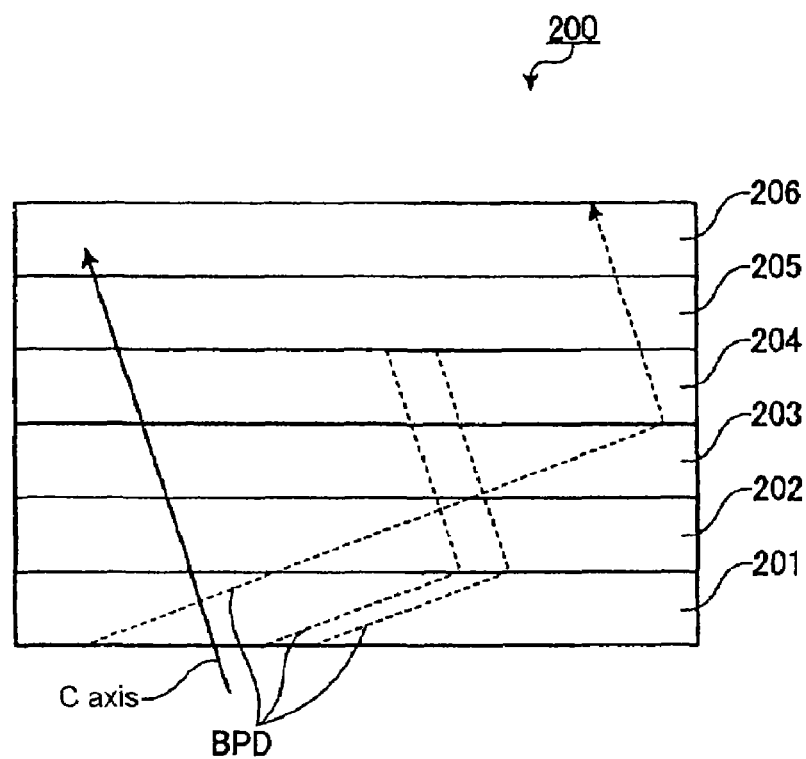
FIG. 2 is a cross-sectional view of a SiC semiconductor substrate according to a second embodiment.
Figure 3:
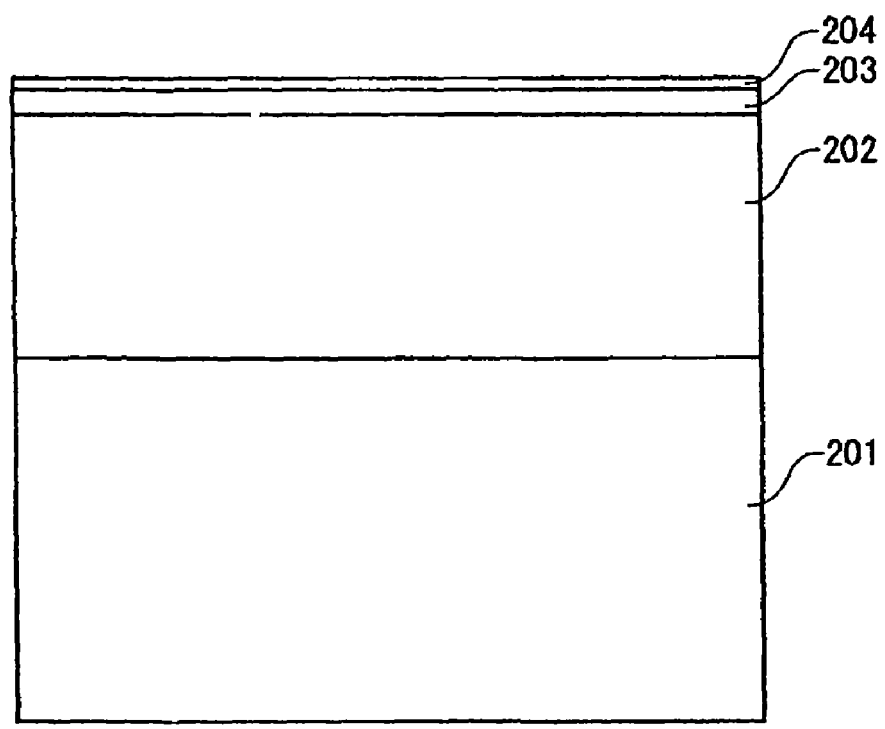
FIG. 3 is a cross-sectional view in the manufacturing process of the SiC semiconductor substrate according to the second embodiment.

FIG. 2 is a cross-sectional view of a SiC semiconductor substrate according to the second embodiment. In addition, FIG. 3 is a cross-sectional view in the manufacturing process of the SiC semiconductor substrate according to the second embodiment. A SiC semiconductor substrate 200 according to the second embodiment comprises a first N-doped n-type SiC epitaxial layer 202 in which nitrogen (N) is doped, a first P-doped n-type SiC epitaxial layer 203 in which phosphorus (P) is doped, a second N-doped n-type SiC epitaxial layer 204, a second P-doped n-type SiC epitaxial layer 205 and a third N-doped n-type SiC epitaxial layer 206, which are laminated on a SiC single crystal substrate 201 sequentially. In this regard, the thickness of each layer is illustrated in FIG. 2 uniformly.

As shown in FIG. 2, the BPDs as shown in dotted lines are converted into edge dislocations at each interface of the SiC epitaxial layers in the SiC semiconductor substrate 200 according to the second embodiment. Thus, the number of BPDs that are converted into the edge dislocations becomes higher in comparison with the first embodiment. Decreasing of such BPDs can be detected by etching in potassium hydroxide (KOH) and counting by SEM observation.

A manufacturing process of the SiC semiconductor substrate 200 according to the second embodiment will be explained. In the second embodiment, a 4H—SiC single crystal in which nitrogen (N) is doped with a doping concentration of $10^{18}$ $cm^{-3}$ is used as the starting substrate as in the first embodiment. By mirror polishing treatment and CMP treatment, the face which is inclined to <11-20> orientation from the (0001) Si face of the starting substrate by eight degrees is polished, and the polished surface is used as the principal surface.

At first, for example, the starting substrate is cut in the shape of the chip of 5 mm×5 mm square using the dicing saw, and the substrate after cutting is cleaned using organic solvent and acid. Subsequently, the substrate whose surface to etch is in an upward direction is put on the susceptor of graphite coated with silicon carbide (SiC). And the susceptor on which the substrate is put is placed in the quartz reaction tube, and the pressure in the quartz reaction tube is brought to less than or equal to 1 Pa with a vacuum pump.

Subsequently, for example, mixed gas having a hydrogen ($H_2$) flow rate of 10 slm and a hydrogen chloride (HCl) flow rate of 5 sccm is introduced in the quartz reaction tube and the pressure in the reaction tube is brought to 100 Torr. In this state, vapor-phase etching is performed at 1600° C. for 5 minutes. In doing so, for example, the susceptor is heated by the high-frequency induction heating method.

Subsequently, for example, a hydrogen ($H_2$) flow rate of 10 slm, a mono-silane ($SiH_4$) flow rate of 3 sccm, a propane ($C_3H_8$) flow rate of 2 sccm and a nitrogen ($N_2$) flow rate of 1 slm are introduced in the reaction tube, and a 4H—SiC thin film (a first nitrogen (N)-doped n-type SiC epitaxial layer 202) is grown epitaxially on the substrate while maintaining in pressure of 90 Torr at 1500° C. for 1 hour. For example, a thickness of the first N-doped n-type SiC epitaxial layer 202 is about 10 μm, and the N-doping concentration is $10^{19}$ $cm^{-3}$. Thus, large-sized defects such as micropipe defects and carrot defects on the substrate decrease to, for example, about 0.4/$cm^2$.

Next, after bringing the quartz reaction tube to a vacuum state of less than or equal to 1 Pa again, for example, a hydrogen ($H_2$) flow rate of 10 slm, a mono-silane ($SiH_4$) flow rate of 3 sccm, a propane ($C_3H_8$) flow rate of 2 sccm and a phosphine ($PH_3$) flow rate of 100 sccm are introduced in the reaction tube, and a first phosphorus (P)-doped 4H—SiC thin film (a P-doped n-type SiC epitaxial layer 203) is grown epitaxially at 1500° C. for 12 minutes. For example, a thickness of the first P-doped n-type SiC epitaxial layer 203 is about 2 μm, and the P-doping concentration is $10^{17}$ $cm^{-3}$.

After this, a supperlattice structure is formed by further growing respectively the second N-doped n-type SiC epitaxial layer 204 and the second P-doped n-type SiC epitaxial layer 205 to a thickness of 500 nm. At last, a third N-doped n-type SiC epitaxial layer 206 is grown to a thickness of 10 μm, and the SiC semiconductor substrate 200 shown in FIG. 2 is formed.

When dislocation density of the SiC thin film which is epitaxially grown like the above is studied, BPD density after having generated the second P-doped n-type SiC epitaxial layer 205 becomes $2 \times 10^2$ $cm^{-2}$, whereas BPD density at the time of generation of the first N-doped n-type SiC epitaxial layer 202 is about $10^{14}$ $cm^{-2}$. In other words, in comparison with BPD density at the time of generation of the first N-doped n-type SiC epitaxial layer 202, about 98% of BPDs after having generated the second P-doped n-type SiC epitaxial layer 205 are converted into edge dislocations.

While the case in which the SiC epitaxial layer of the n-type is formed is described in the embodiments, in the case that a SiC epitaxial layer of a p-type is formed, it is preferable that, for example, at least two of boron (B), aluminum (Al), and indium (In) are used as dopants.

As discussed above, according to the silicon carbide semiconductor devices and the method for manufacturing such silicon carbide semiconductor devices according to the embodiment, a plurality of the SiC thin films in which different materials are doped are formed by growing epitaxially more than once using a plurality of different dopants. At each interface of a plurality of the SiC thin films, the directions of the dislocations of the BPDs change, and the BPDs are converted into edge dislocations. Thus, the BPDs in the SiC semiconductor device are reduced, and the device property can be improved.

As described above, the silicon carbide semiconductor device and the method for manufacturing such silicon carbide semiconductor devices according to the invention are useful for a power semiconductor device such as an IGBT (Insulated Gate Bipolar Transistor) used for an industry field such as a general purpose inverter, an AC servo, uninterruptible power supply (UPS) or switching power supply, and used for a consumer equipment field such as a microwave oven, a rice cooker or a stroboscope.

DENOTATION OF REFERENCE NUMERALS 101 silicon carbide single crystal substrate
102 N-doped n-type SiC epitaxial layer
103 P-doped n type SiC epitaxial layer

What is claimed is:

1. A method for manufacturing a silicon carbide semiconductor device comprising:
    alternating laminating a plurality of first and second silicon carbide epitaxial layers sequentially on a first conductivity type silicon carbide substrate,
    wherein each of the plurality of first and second silicon carbide epitaxial layers is of the first conductivity type,
    the plurality of first silicon carbide epitaxial layer of the first conductivity type consists of a first type of impurity dopants,
    the plurality of second silicon carbide epitaxial layer of the first conductivity type consists of a second type of impurity dopants,
    the plurality of first and second silicon carbide epitaxial layers are formed with mutually exclusive types of impurity dopants such that the first silicon carbide epitaxial layer does not contain the type of impurity dopants used in the adjacent second silicon carbide epitaxial layer and the second silicon carbide epitaxial layer does not contain the type of impurity dopant used in the adjacent first silicon carbide epitaxial layer; and
    wherein the impurity concentrations between an adjacent pair of first and second silicon carbide epitaxial layers are different from each other.

2. The method for manufacturing the silicon carbide semiconductor device according to claim 1, wherein each silicon carbide epitaxial layer is a silicon carbide epitaxial layer of an n-type, wherein the first epitaxial layer uses nitrogen as the impurity dopant and the second epitaxial layer which is adjacent to the first epitaxial layer uses phosphorus as the impurity dopant.

3. The method for manufacturing the silicon carbide semiconductor device according to claim 1, wherein each silicon carbide epitaxial layer is a silicon carbide epitaxial layer of a p-type, and at least two of boron, aluminum, and indium are used as the impurities when the first silicon carbide epitaxial layer is formed.

4. The method for manufacturing the silicon carbide semiconductor device according to claim 1, wherein the first epitaxial layer uses nitrogen as the impurity dopant and the second epitaxial layer which is adjacent to the first epitaxial layer uses phosphorus as the impurity dopant.

5. A silicon carbide semiconductor device comprising:
    a silicon carbide substrate of a first conductivity type;
    a plurality of first silicon carbide epitaxial layers and a plurality of second silicon carbide epitaxial layers alternately laminated on the silicon carbide substrateM
    wherein each of the plurality of first and second silicon carbide epitaxial layers is of the first conductivity type,
    the plurality of first silicon carbide epitaxial layer of the first conductivity type consists of a first type of impurity dopants,
    the plurality of second silicon carbide epitaxial layer of the first conductivity type consists of a second type of impurity dopants,
    the plurality of first and second silicon carbide epitaxial layers are formed with mutually exclusive types of impurity dopants such that the first silicon carbide epitaxial layer does not contain the type of impurity dopants used in the adjacent second silicon carbide epitaxial layer and the second silicon carbide epitaxial layer does not contain the type of impurity dopant used in the adjacent first silicon carbide epitaxial layer; and
    wherein the impurity concentrations between an adjacent pair of first and second silicon carbide epitaxial layers are different from each other.

6. The silicon carbide semiconductor device according to claim 5, wherein the first silicon carbide epitaxial layers are p-type silicon carbide epitaxial layers in which at least two of boron, aluminum, and indium are doped as impurity dopants.

7. The silicon carbide semiconductor device according to claim 5, wherein the silicon carbide substrate is doped with a p-type or an n-type impurity dopant and the concentration of the impurity dopant in said silicon carbide substrate is different from the concentration of the impurity dopant in each of said epitaxial layers.

8. The silicon carbide semiconductor device according to claim 5, wherein the silicon carbide substrate is doped with a p-type or an n-type impurity, and at least one of the silicon carbide epitaxial layers is doped with a different impurity dopant from the impurity dopant introduced into the silicon carbide substrate.

* * * * *